US010663485B1

(12) United States Patent
Ukhanov et al.

(10) Patent No.: US 10,663,485 B1
(45) Date of Patent: May 26, 2020

(54) VCSEL-BASED RESONANT-CAVITY-ENHANCED ATOMIC FORCE MICROSCOPY ACTIVE OPTICAL PROBE

(71) Applicants: Alexander A. Ukhanov, Albuquerque, NM (US); Gennady A. Smolyakov, Albuquerque, NM (US)

(72) Inventors: Alexander A. Ukhanov, Albuquerque, NM (US); Gennady A. Smolyakov, Albuquerque, NM (US)

(73) Assignee: ACTOPROBE LLC, Albuquerque, NM (US)

( * ) Notice: Subject to any disclaimer, the term of this patent is extended or adjusted under 35 U.S.C. 154(b) by 0 days.

(21) Appl. No.: 16/031,328

(22) Filed: Jul. 10, 2018

(51) Int. Cl.
*G01Q 60/40* (2010.01)
*G01Q 60/42* (2010.01)
*H01S 5/183* (2006.01)
*G01Q 60/06* (2010.01)
*G01Q 70/02* (2010.01)
*H01S 5/022* (2006.01)
*G01Q 70/10* (2010.01)

(52) U.S. Cl.
CPC .............. *G01Q 60/40* (2013.01); *G01Q 60/06* (2013.01); *G01Q 60/42* (2013.01); *G01Q 70/02* (2013.01); *G01Q 70/10* (2013.01); *H01S 5/02268* (2013.01); *H01S 5/183* (2013.01)

(58) Field of Classification Search
CPC ........ G01Q 60/06; G01Q 60/40; G01Q 60/42; G01Q 60/18; G01Q 60/22; G01Q 70/02; G01Q 70/10; H01S 5/02268; H01S 5/183
See application file for complete search history.

(56) References Cited

U.S. PATENT DOCUMENTS

| | | | | |
|---|---|---|---|---|
| 6,408,123 B1 * | 6/2002 | Kuroda | ............... | B82Y 20/00 359/368 |
| 6,852,968 B1 * | 2/2005 | Ouchi | ............... | B82Y 20/00 250/201.3 |
| 9,482,691 B1 * | 11/2016 | Ukhanov | ............... | G01Q 20/04 |
| 2014/0196179 A1 * | 7/2014 | Englund | ............... | B82Y 35/00 850/1 |

OTHER PUBLICATIONS

Gorecki et al, "New SNOM Sensor Using Optical Feedback in a VCSEL-Based Compound-Cavity", Sensors and Actuators A: Physical, vol. 8, Issue 3, 2001, p. 113-123 (Year: 2001).*

* cited by examiner

*Primary Examiner* — David E Smith

(57) ABSTRACT

A new resonant-cavity-enhanced Atomic Force Microscopy (AFM) active optical probe integrates a semiconductor laser source and an aperture AFM/near-field scanning optical microscopy (NSOM) probe in either external-resonant-cavity or internal-resonant-cavity configuration to enable both conventional AFM measurements and optical imaging and spectroscopy at the nanoscale.

79 Claims, 11 Drawing Sheets

VCSEL-BASED RESONANT-CAVITY-ENHANCED ATOMIC FORCE MICROSCOPY ACTIVE OPTICAL PROBE

FIELD OF THE INVENTION

The present invention relates to atomic force microscopy (AFM) and near-field optical microscopy probes and, in particular, to a vertical-cavity surface-emitting laser (VCSEL)-based resonant-cavity-enhanced AFM active optical probe capable of performing both conventional AFM measurements and optical imaging and spectroscopy at the nanoscale.

BACKGROUND OF THE INVENTION

The existing Raman microscopy technology is time-consuming, difficult to use, expensive, and not available to most scientists, engineers, medical doctors and technical personnel who need to test optical/chemical properties of the sample at the nanoscale—in most cases simultaneously with conventional AFM imaging.

Attempts at combining AFM and optical techniques have been made in the past. Combining AFM with traditional microscopy methods has become quite common, as it provides a means for simultaneous application of external forces, quantitative measurements and direct visualization of the perturbed surface of the sample. Much less evolved is the combination of AFM and Raman spectroscopy.

Conventional Raman spectroscopy is known to suffer from low efficiency and sensitivity, as it relies on the highly inefficient process of inelastic light scattering. Surface-enhanced Raman spectroscopy (SERS) combines spontaneous Raman spectroscopy with the local field enhancement capability of gold or silver nanostructures to amplify the signal by 3 to 4 orders of magnitude. Using the same field-enhancing effects as in SERS, tip-enhanced Raman spectroscopy (TERS) combines the strong enhancement of SERS and scanning probe imaging to achieve high spatial resolution (~30 nm) with high sensitivity. TERS is a near-field technique, where a metallic or metallized scanning probe microscopy (SPM) tip is used as an optical nano-antenna to confine and enhance an electromagnetic field in close proximity to the sample surface. In TERS, the external excitation laser light is used for side illumination of the tip. TERS performance, therefore, is challenged by low efficiency of coupling the laser light into the near-field mode of the optical AFM probe, leading to a tremendous optical power loss and large background signal. TERS would greatly benefit from further sensitivity enhancement, but this cannot be achieved by simply increasing the excitation power. New excitation/detection strategies are required to solve the TERS low signal-to-noise ratio (data quality) problem.

SUMMARY OF THE INVENTION

In view of the above problems, it is therefore the object of the present invention to provide a novel class of hybrid AFM/optical probes (resonant-cavity-enhanced AFM active optical probe—RCE AAOP) by combining a light source (VCSEL) and an aperture AFM/near-field scanning optical microscopy (NSOM) probe in either external-resonant-cavity or internal-resonant-cavity configuration.

We propose a special probe for combined AFM, NSOM, and TERS measurements that will efficiently overcome the limitations of current TERS and NSOM techniques to advance these technologies further. This innovation is accomplished by integrating a semiconductor laser source and a specially designed atomic-force/NSOM probe into a special AFM probe holder compatible with conventional AFM. Specifically, the new probe combines a light source (VCSEL) and a special aperture NSOM probe in either external-resonant-cavity or internal-resonant-cavity configuration. In both cases, we use the large intensity of the intracavity laser light transmitted through a sub-wavelength hole (tip aperture) for efficient excitation of the sample at the nanoscale.

In the external-resonant-cavity configuration, we use the effect of external-resonance-enhanced transmission of light through sub-wavelength holes [Kalkum 2010] that allows up to 100× enhanced light transmission through the tip aperture. In this configuration, the top (output) DBR mirror of the VCSEL and the gold-coated surface of the probe tip form an external Fabry-Pérot cavity employed for enhanced transmission of light through the tip aperture.

In the internal-resonant-cavity configuration, the top (output) DBR mirror of the VCSEL is replaced by the gold-coated surface of the aperture probe tip. Monolithically integrated into the VCSEL structure or suspended above the active region on the membrane of a microelectromechanical system (MEMS), the gold-coated surface of the tip acts as a cavity mirror that together with the bottom DBR mirror forms the internal cavity of the VCSEL or MEMS-VCSEL. The effect of greatly enhanced light transmission in such configuration has been demonstrated in the very-small-aperture lasers (VSALs)—laser diodes with a metal-coated facet where a small aperture has been created. VSALs have demonstrated more than a $10^4$× increase of output power over metal-coated tapered fibers with comparable aperture diameters [Partovi 1999].

The resonant-cavity-enhanced configuration of the probe substantially alleviates the requirements for the power of the excitation source. In particular, VCSELs with their circular output beams of very low divergence become acceptable as the laser sources for TERS, in spite of their low output power. In the proposed configurations, top illumination rather than side illumination of the tip is used. The excitation light is supplied axially through the tip; hence there is very little scattered light and therefore significantly reduced background noise.

In one illustrative embodiment of the present invention, NSOM and TERS measurements will be enabled by using an external photodetector and a Raman spectrometer. Another illustrative embodiment of the present invention envisions a method of fabricating several resonant photodetectors/Raman sensors/Raman spectrometers, monolithically integrated with the VCSEL source, from a GaAs-based semiconductor material suitable as the basis for optical device fabrication. The laser and detector functionalities for RCE AAOP are enabled by an epitaxially grown structure. The choice of GaAs is motivated by the large base of established fabrication technology, which allows for time- and cost-effective fabrication of the probes. Practice of the present invention can be easily extended to alternative III-V semiconductors such as InP, GaP, GaSb, and GaN to expand the available wavelength coverage from UV to visible and mid-infrared.

Practice of the present invention can be advantageous to provide high-performance low-cost probes for atomic force microscopy with enhanced functionality to include that of NSOM, TERS, or hybrid AFM. The RCE AAOP in its resonant-cavity-enhanced configuration and with its integrated light source and detector has the potential to outperform the above-mentioned technologies for optical characterization at the nanoscale.

The enhanced functionality can be achieved at a price much smaller than the cost of purchasing a dedicated NSOM or TERS instrument. The RCE AAOP fabrication technology essentially combines the two well-developed technologies: AFM probe fabrication and VCSEL fabrication. The fabrication process should allow for high-volume manufacturing, resulting in a cost-effective affordable product that can be adopted for use by all current owners of atomic force microscopes. The cost advantage compared to an NSOM instrument would be on the order of 10-100 times, and RCE AAOP has the potential to outperform NSOM as described above. The low cost and simplicity of use of RCE AAOP will open up new important opportunities for the application of near-field optical microscopy for research and engineering in academia and industry.

These and other advantages of the present invention will become more readily apparent from the following detailed description taken with the following drawings.

DETAILED DESCRIPTION OF THE INVENTION

The RCE AAOP concept is based on combining a VCSEL light source and an aperture AFM/NSOM probe in either external-resonant-cavity or internal-resonant-cavity configuration. Some preferred embodiments of the invention will be described below in detail based on the drawings.

Embodiment 1

Figure 1:
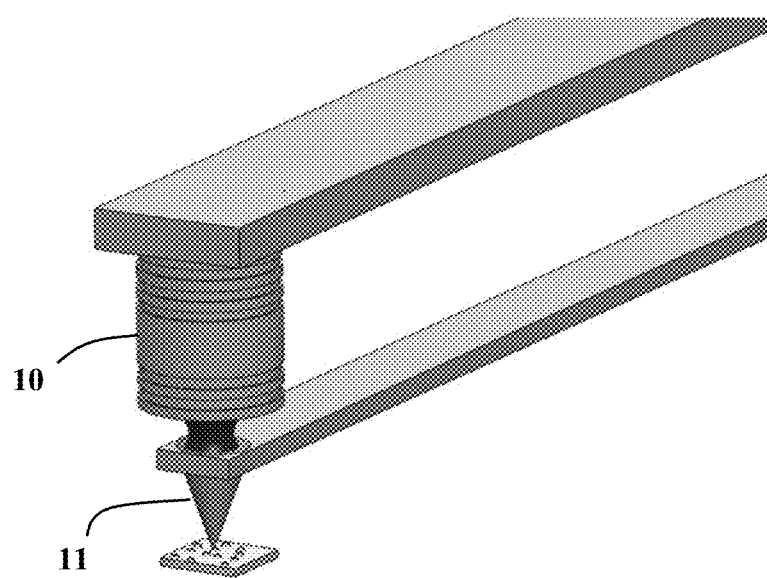
FIG. 1 is a three-dimensional illustration of the RCE AAOP concept in the external-resonant-cavity configuration.
Figure 2:
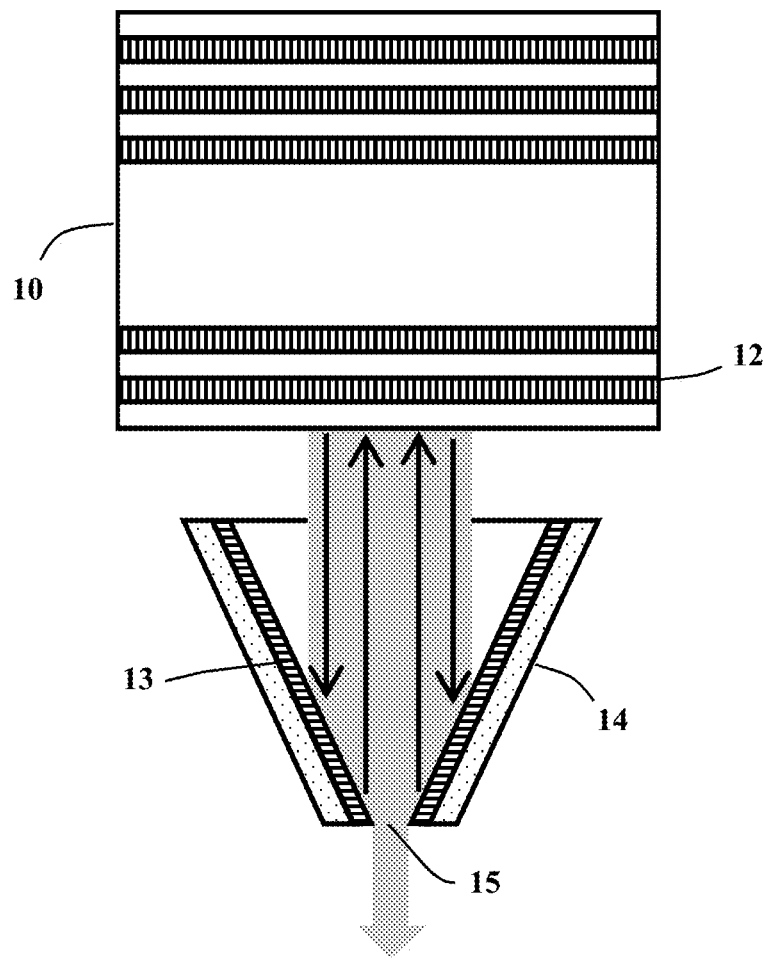
FIG. 2 is a schematic of Fabry-Pérot-enhanced light transmission through an aperture probe.

The concept of the resonant-cavity-enhanced AFM active optical probe (RCE AAOP) is illustrated in FIG. 1, where the probe combines a light source 10 (VCSEL) and a special aperture NSOM probe 11 in the external-resonant-cavity configuration. In this configuration, the top (output) DBR mirror 12 of the VCSEL 10 and the gold-coated surface 13 of the tip 14 of the special aperture NSOM probe form a high-quality external Fabry-Pérot cavity employed for enhanced transmission of light through the tip aperture 15 (FIG. 2). In this external-resonant-cavity configuration, we use the effect of external-resonance-enhanced transmission of light through sub-wavelength holes [Kalkum 2010] that allows up to 100× enhanced light transmission through the tip aperture. The large intensity of the laser light that builds up in the external cavity is efficiently transmitted through the tip aperture 15 and used for excitation of the sample at the nanoscale.

Figure 3:
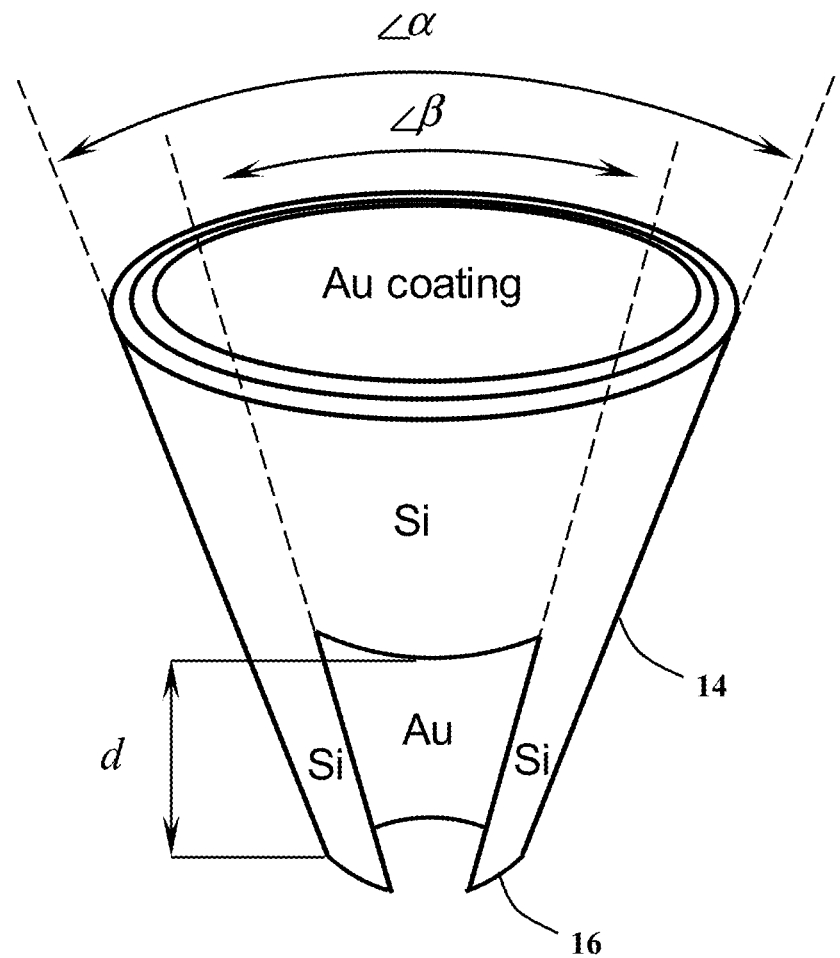
FIG. 3 is a schematic of the asymmetric design for NSOM probe tip.

The special NSOM aperture probe may have an asymmetric design (FIG. 3). The asymmetry introduced by removing a part of the tip apex is expected to improve TERS measurement due to local optical field enhancement at the remaining part of the tip apex 16.

Figure 4:
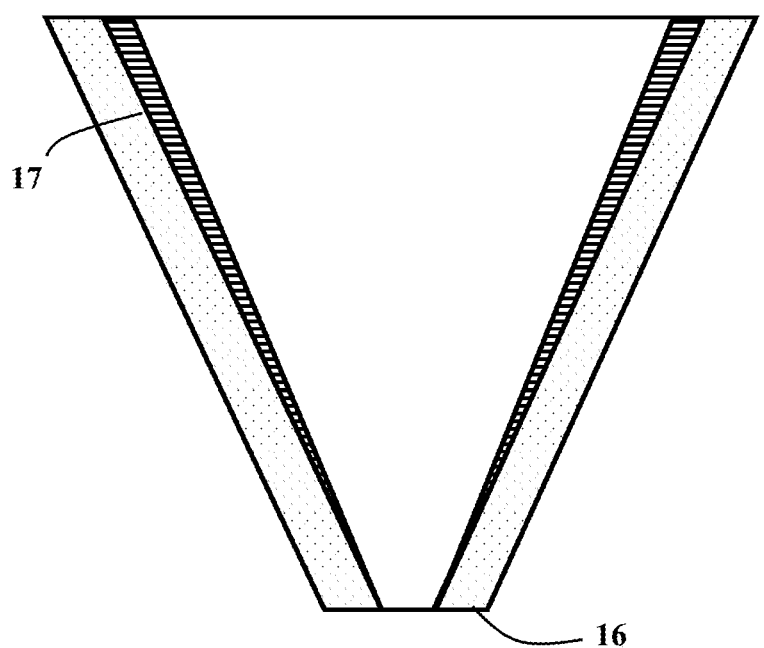
FIG. 4 is a schematic of the asymmetric design for NSOM probe tip, with the thickness of the metal coating gradually reduced as it approaches the tip apex.

Enhanced transmission of light through subwavelength apertures in metallic films has been the focus of much research activity in the last decade [Garcia-Vidal 2010]. The typical problem with conventional NSOM probes made of tapered metal-coated optical fibers is the dramatic loss of the light power through heat dissipation in the taper region of the fiber where it is operating as a metal-clad waveguide beyond waveguide cutoff. Further increase in the input power causes the metal coating to melt and catastrophically destroy the probe [Partovi 1999]. On the other hand, the VSALs have demonstrated more than a $10^4\times$ increase of output power over metal-coated tapered fibers with comparable aperture diameters [Partovi 1999]. The flat geometry of the laser facet, however, does not allow VSALs to be used as probes. Between these two extreme cases, one needs to find a balanced solution for a convenient geometry of the NSOM aperture probe that would keep, as much as possible, the excellent light transmission properties of VSALs. Our preferable design is the NSOM aperture probe of FIG. 3 with the angle $\alpha$ equal to 90°, where the probe acts as a right-angle reflector to form a high-quality external cavity. Other geometries with $\alpha<90°$ and $\alpha>90°$ are also possible. In general, the tip 14 geometry (parameters d, $\alpha$, and $\beta$ in FIG. 3) is optimized to maximize the light power delivered to the probe tip apex, for example, by shortening the distance for the light propagation inside the metal-clad waveguide under cutoff conditions. In addition to that, the thickness of the metal coating 17 can be gradually reduced as it approaches the probe tip apex 16 (FIG. 4). If necessary, the quality of the external resonant cavity of FIG. 2 can be further enhanced by introducing a properly designed microlens.

Figure 5:
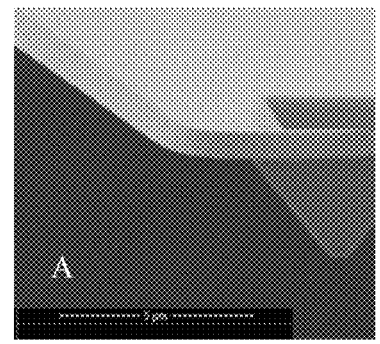
FIG. 5. NSOM probe with two apertures (openings): one at the top (A) and one at the bottom (B, C).
Figure 5:
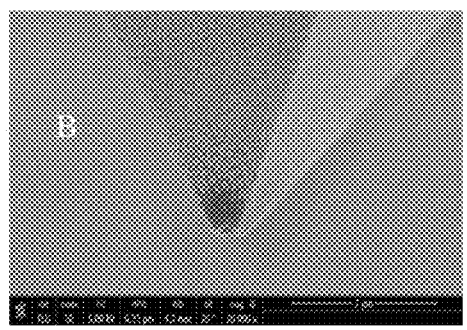
Figure 5:
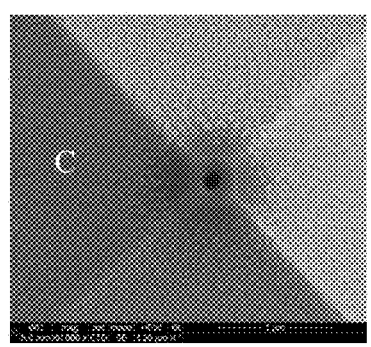

A prototype of such a probe made of silicon is shown in FIG. 5. FIG. 5 shows a special design of AFM/NSOM probe with two apertures (openings): one at the top (FIG. 5A) to couple the laser light into the probe tip and one at the bottom (FIGS. 5B, C) to couple the light out (no metal coating has been applied).

Commercial unpackaged VCSELs fabricated as chip-on-submount devices can be used as the light source. The VCSEL source is mounted on an x-y-z piezo stage attached to a special AFM probe holder for precise positioning relative to the probe tip. Being an integral part of the AFM cantilever, the probe tip is attached to the special AFM probe holder independently. The holder allows replacing the NSOM probes and is compatible with conventional AFM. To take advantage of the effect of external-resonance-enhanced transmission of light through the sub-wavelength aperture of the probe, the output mirror of the VCSEL source has to be very close to the probe tip (from 1 µm to 500 µm), thus forming a high-quality external cavity. The optimal distance D between the VCSEL source and the probe tip can be determined in an experiment where this distance is varied while monitoring the NSOM probe output as a function of D (external cavity length). For a fixed wavelength of the VCSEL source, the intensity signal is expected to be oscillating following the changing transmission of the external cavity (Fabry-Pérot effect).

In the described embodiment of the present invention, NSOM and TERS measurements are enabled by applying far-field optics to collect the scattered light and direct it to a combination of an external Raman spectrometer and an external photodetector.

Embodiment 2

Figure 6:
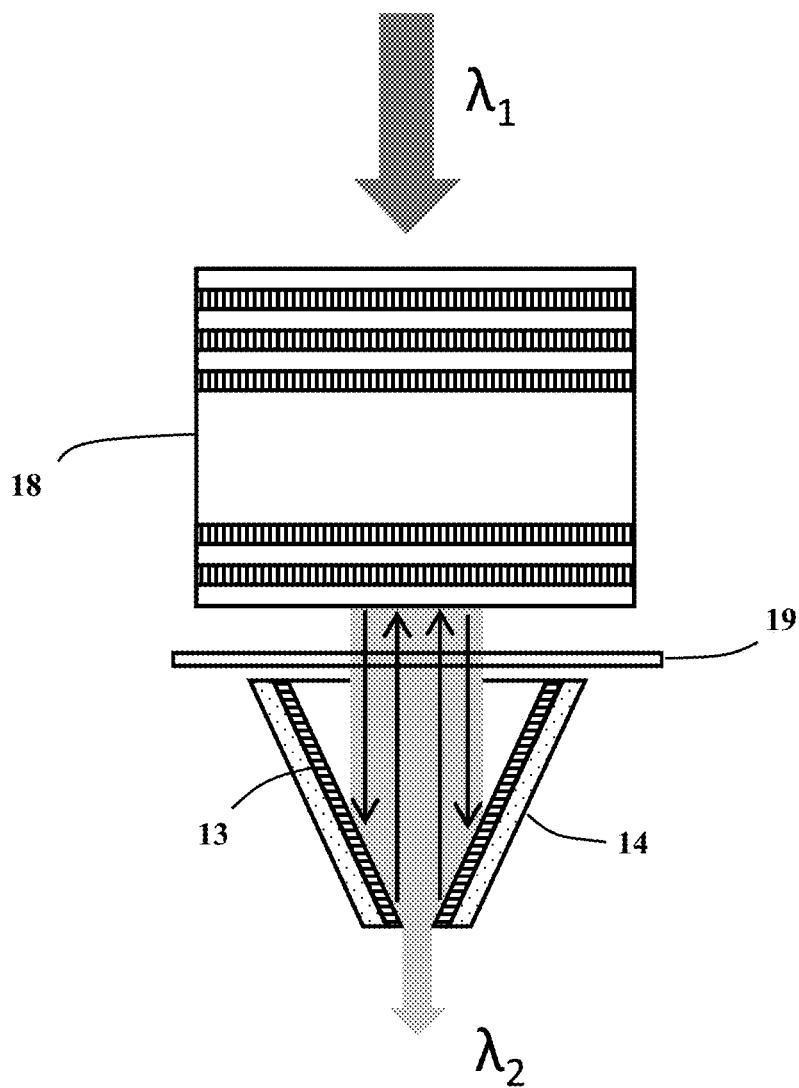
FIG. 6 is a schematic illustration of Embodiment 2 of a resonant-cavity-enhanced AFM active optical probe according to the invention.

In another embodiment of the present invention, the resonant-cavity-enhanced AFM active optical probe is that described in Embodiment 1, but the laser source is an optically pumped VCSEL (FIG. 6). The optically pumped VCSEL 18 generates light at the wavelength $\lambda_2$ that is longer that the wavelength $\lambda_1$ of the optical pumping. A special notch (band-stop) or longpass edge filter 19 is placed inside the external cavity formed by the top (output) DBR mirror 12 of the VCSEL and the gold-coated surface 13 of the tip 14 of the special aperture NSOM probe to prevent the optical pumping (light at $\lambda_1$ wavelength) from reaching the surface of the sample (FIG. 6).

In the described embodiment of the present invention, NSOM and TERS measurements are enabled by applying far-field optics to collect the scattered light and direct it to a combination of an external Raman spectrometer and an external photodetector. The described embodiment is advantageous for Raman measurements that would benefit from shorter wavelength (UV/VIS) excitation.

Embodiment 3

Figure 7:
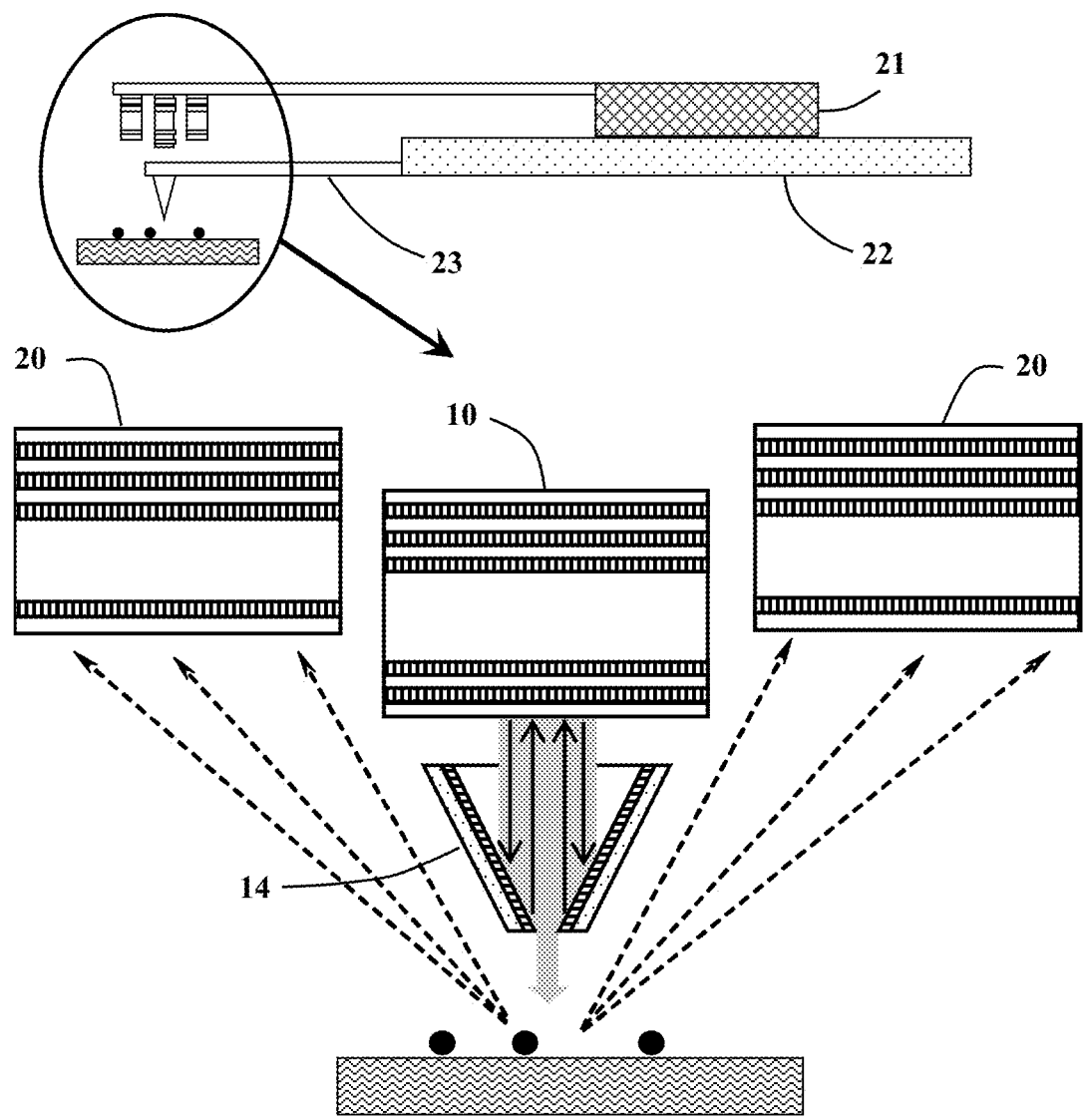
FIG. 7 is a schematic illustration of Embodiment 3 of a resonant-cavity-enhanced AFM active optical probe according to the invention.

In another embodiment of the present invention, an arrangement of several commercial reverse-biased VCSEL structures are employed as near-field resonant-cavity-enhanced (RCE) photodetectors 20. They are mounted in very close proximity to a VCSEL source 10 on the same x-y-z piezo stage 21 attached to a special AFM probe holder 22 for precise positioning relative to the special aperture NSOM probe tip 14 (FIG. 7). Being an integral part of the AFM cantilever 23, the probe tip is attached to the special AFM probe holder 22 independently. The RCE photodetectors 20 are designed for detection in a narrow spectral range around the wavelength at which the VCSEL source 10 emits.

In the described embodiment of the present invention, no far-field optics is necessary for signal collection/detection. NSOM measurements are enabled in the near-field by applying the VCSEL excitation source 10 and the near-field RCE photodetectors 20 for signal detection.

Embodiment 4

Figure 8:
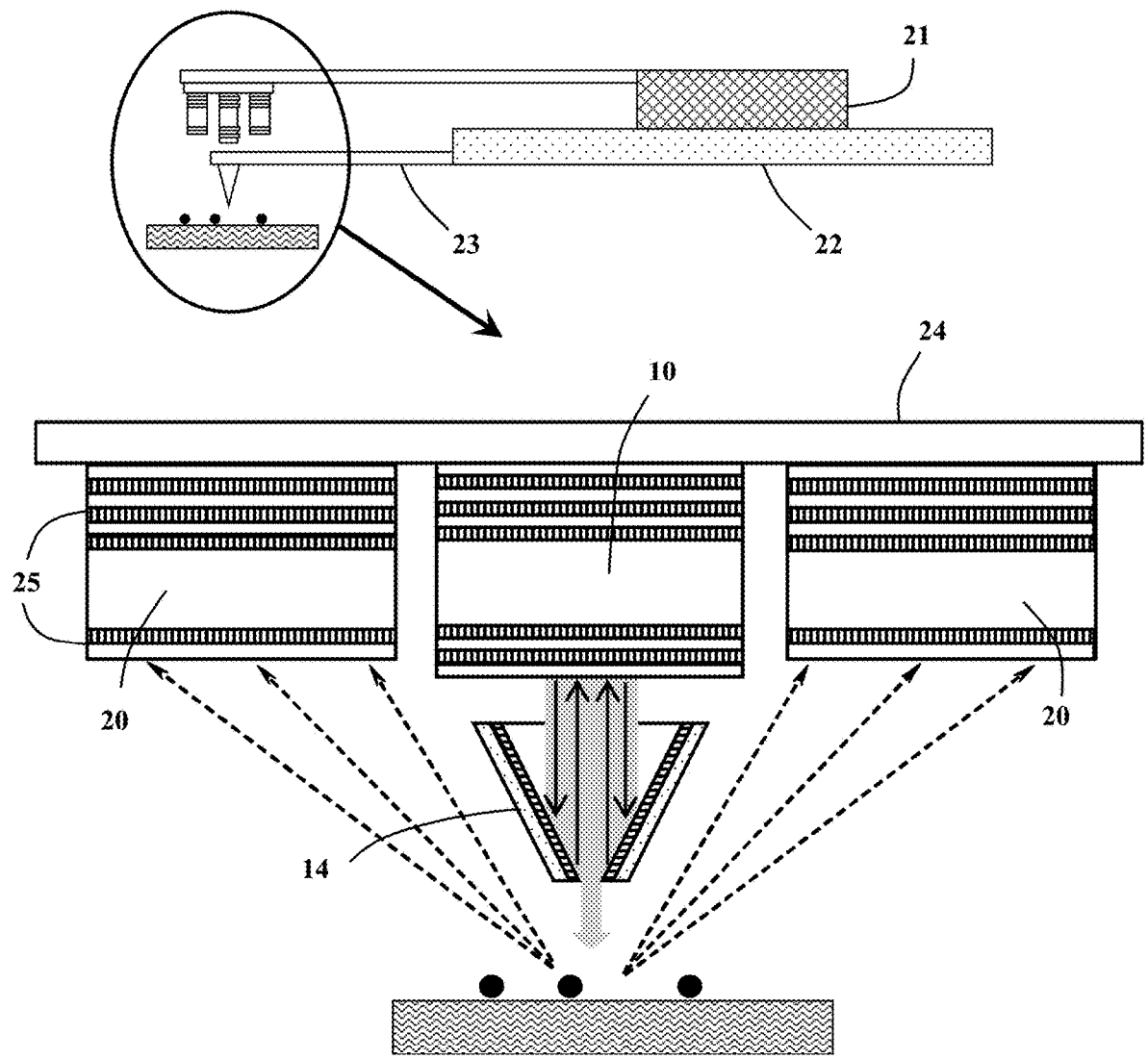
FIG. 8 is a schematic illustration of Embodiment 4 of a resonant-cavity-enhanced AFM active optical probe according to the invention.

In yet another embodiment of the present invention, an arrangement of several reverse-biased VCSEL structures, employed as near-field resonant-cavity-enhanced (RCE) photodetectors 20, are monolithically integrated with a VCSEL source 10 on the same GaAs substrate 24 (FIG. 8). The laser and detector functionalities for RCE AAOP are enabled by an epitaxially grown GaAs-based semiconductor structure. The choice of GaAs is motivated by the large base of established fabrication technology, which allows for time- and cost-effective fabrication of the probes. Practice of the present invention can be easily extended to alternative III-V semiconductors such as InP, GaP, GaSb, and GaN to expand the available wavelength coverage from UV to visible and mid-infrared. The RCE photodetectors 20 and VCSEL source 10 are formed by processing the epitaxial laser wafer to be in very close proximity to each other to enable near-field detection for RCE AAOP. Monolithically integrated on the same semiconductor substrate 24, the RCE photodetectors 20 and VCSEL source 10 are then mounted on the same x-y-z piezo stage 21 attached to a special AFM probe holder 22 for precise positioning relative to the special aperture NSOM probe tip 14 (FIG. 8). Being an integral part of the AFM cantilever 23, the probe tip 14 is attached to the special AFM probe holder 22 independently. The monolithic RCE photodetectors 20 are designed for detection in a narrow spectral range around the wavelength at which the VCSEL source 10 emits (the resonant wavelength of the detectors).

In the described embodiment of the present invention, the RCE photodetectors 20 can have a wavelength tuning capability enabled by the electrically tunable bottom and top DBR mirrors 25 of the RCE photodetector cavity. Tuning of the RCE photodetector 20 resonant wavelength is enabled by applying tuning electrical currents through the DBR semiconductor layers to change the temperature and therefore the refractive indices of the layers, and eventually the resonant wavelength of the DBR mirrors.

Alternatively, the wavelength tuning capability of the RCE photodetectors 20 can be enabled by the top DBR mirror composed of dielectric materials possessing large electro-optic effects. Tuning of the RCE photodetector resonant wavelength in this case is enabled by applying a constant voltage across the top DBR dielectric layers to change the refractive indices of the layers, and therefore the resonant wavelength of the top DBR mirror. In the both RCE photodetector configurations, the electrical circuits for wavelength tuning are electrically isolated from the electrical circuit that enables photocurrent detection. The wavelength-tunable RCE photodetectors can be used as a Raman spectrometer/detector.

In the described embodiment of the present invention, no far-field optics is necessary for signal collection/detection. NSOM measurements are enabled in the near-field by applying the VCSEL excitation source 10 and the monolithically integrated RCE photodetectors 20 for signal detection. In the case of tunable RCE photodetectors, TERS measurements are enabled in the near-field by applying the VCSEL excitation source and the monolithically integrated tunable RCE photodetectors for Raman signal detection.

Embodiment 5

Figure 9:
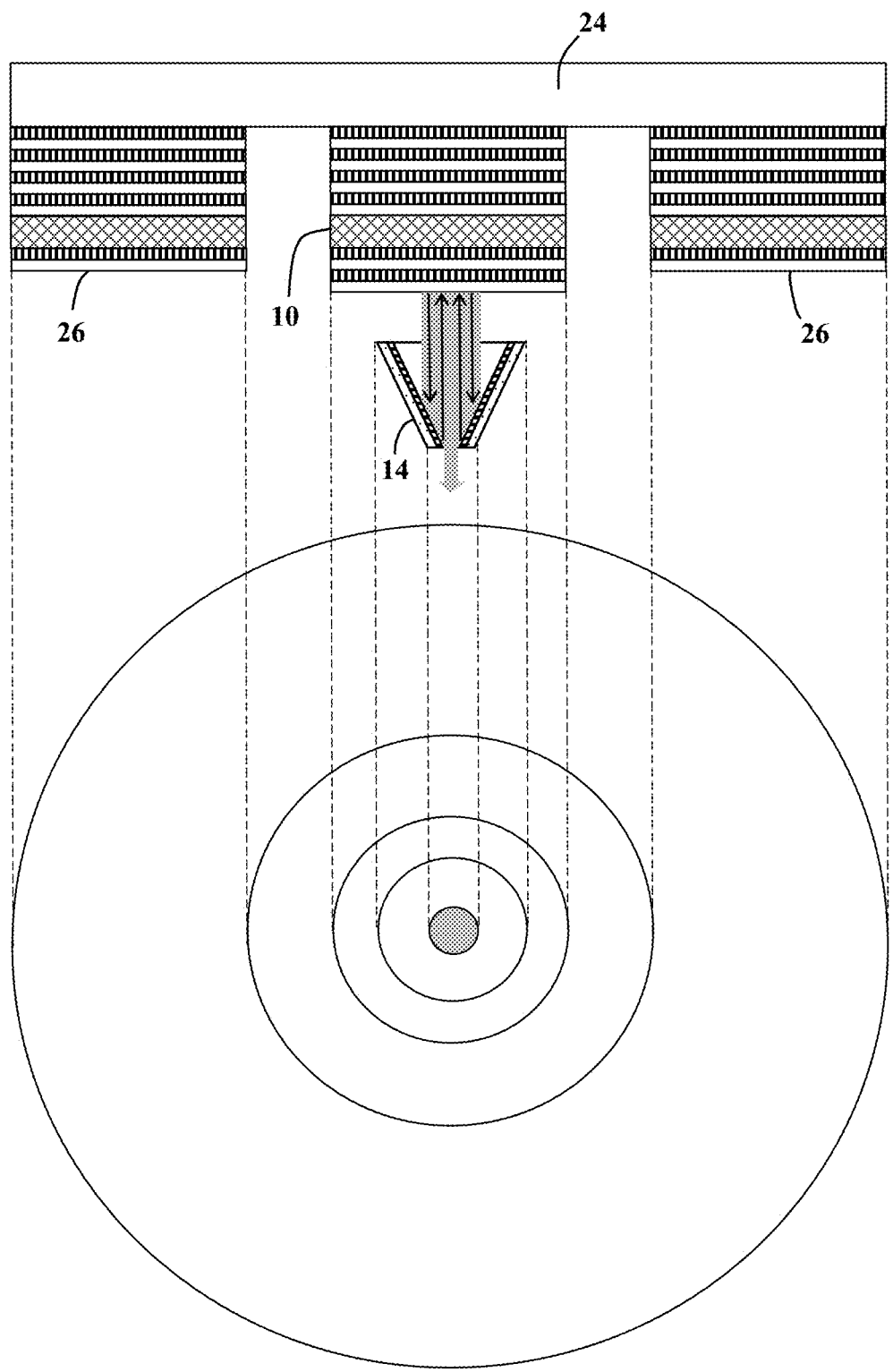
FIG. 9 is a schematic illustration of Embodiment 5 of a resonant-cavity-enhanced AFM active optical probe according to the invention.

In yet another embodiment of the present invention, a ring-shaped RCE photodetector 26 is monolithically integrated with a VCSEL source 10 on the same GaAs substrate 24 (FIG. 9). The laser and detector functionalities for RCE AAOP are enabled by an epitaxially grown GaAs-based semiconductor structure. The choice of GaAs is motivated by the large base of established fabrication technology, which allows for time- and cost-effective fabrication of the probes. Practice of the present invention can be easily extended to alternative III-V semiconductors such as InP, GaP, GaSb, and GaN to expand the available wavelength coverage from UV to visible and mid-infrared. The ring RCE photodetector 26 and VCSEL source 10 are formed by processing the epitaxial laser wafer to be in very close proximity to each other to enable near-field detection for RCE AAOP. Monolithically integrated on the same semiconductor substrate 24, the ring RCE photodetector 26 and VCSEL source 10 are then mounted on the same x-y-z piezo stage attached to a special AFM probe holder for precise positioning relative to the special aperture NSOM probe tip 14. Being an integral part of the AFM cantilever, the probe tip 14 is attached to the special AFM probe holder independently. The monolithic ring-shaped RCE photodetector 26 is designed for detection in a narrow spectral range around the wavelength at which the VCSEL source 10 emits.

In the described embodiment of the present invention, the ring-shaped RCE photodetector 26 can have a wavelength tuning capability enabled by the electrically tunable bottom and top DBR mirrors of the RCE photodetector cavity. Tuning of the ring-shaped RCE photodetector resonant wavelength is enabled by applying tuning electrical currents through the DBR semiconductor layers to change the temperature and therefore the refractive indices of the layers, and eventually the resonant wavelength of the DBR mirrors.

Alternatively, the wavelength tuning capability of the ring-shaped RCE photodetector 26 can be enabled by the top DBR mirror composed of dielectric materials possessing large electro-optic effects. Tuning of the ring-shaped RCE photodetector resonant wavelength in this case is enabled by applying a constant voltage across the top DBR dielectric layers to change the refractive indices of the layers, and therefore the resonant wavelength of the top DBR mirror. In the both ring-shaped RCE photodetector configurations, the electrical circuits for wavelength tuning are electrically isolated from the electrical circuit that enables photocurrent detection. The wavelength-tunable ring-shaped RCE photodetector can be used as a Raman spectrometer/detector.

In the described embodiment of the present invention, no far-field optics is necessary for signal collection/detection. NSOM measurements are enabled in the near-field by applying the VCSEL excitation source 10 and the monolithically integrated ring-shaped RCE photodetector 26 for signal detection. In the case of tunable ring-shaped RCE photodetector, TERS measurements are enabled in the near-field by applying the VCSEL excitation source and the monolithically integrated tunable ring-shaped RCE photodetector for Raman signal detection.

Embodiment 6

Figure 10:
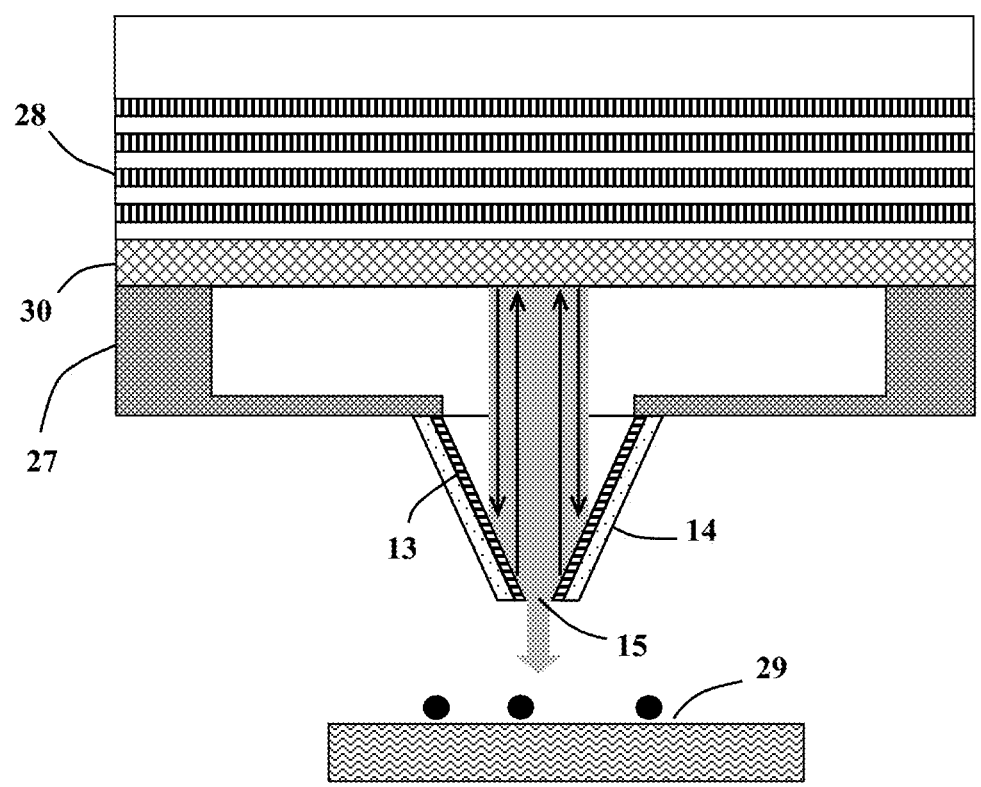
FIG. 10 is a schematic illustration of Embodiment 6 of a resonant-cavity-enhanced AFM active optical probe according to the invention.

In yet another embodiment of the present invention, the probe combines a light source (VCSEL) and a special aperture NSOM probe in the internal-resonant-cavity configuration. Suspended above the laser active region on the membrane 27 of a microelectromechanical system (MEMS), the gold-coated surface 13 of the tip 14 acts as a cavity mirror that together with the bottom DBR mirror 28 forms the high-quality internal cavity of the MEMS-VCSEL (FIG. 10). The effect of greatly enhanced light transmission in such configuration has been demonstrated in the VSALs that have demonstrated more than a $10^4\times$ increase of output power over metal-coated tapered fibers with comparable aperture diameters [Partovi 1999]. The large intensity of the laser light that builds up in the cavity is efficiently transmitted through the tip aperture 15 and used for excitation of the sample 29 at the nanoscale.

The special NSOM aperture probe may have the asymmetric design described in Embodiment 1 (FIG. 3). The asymmetry introduced by removing a part of the tip apex is expected to improve TERS measurement due to local optical field enhancement at the remaining part of the tip apex.

The MEMS-VCSEL source with the suspended special NSOM aperture probe is attached to an AFM cantilever mounted into a special AFM probe holder compatible with conventional AFM. To take advantage of the effect of resonance-enhanced transmission of light through the subwavelength aperture of the probe, the gold-coated surface of the tip 13 (that acts as a cavity mirror) has to be at the optimal distance from the laser active region 30 for the laser cavity optical length to meet the phase-matching conditions for lasing. This adjustment is done by applying voltage to the MEMS membrane while monitoring the NSOM probe output as a function of the internal cavity length.

In the described embodiment of the present invention, NSOM and TERS measurements are enabled by applying far-field optics to collect the scattered light and direct it to a combination of an external Raman spectrometer and an external photodetector.

Embodiment 7

In yet another embodiment of the present invention, an arrangement of several commercial reverse-biased VCSEL structures are employed as near-field resonant-cavity-enhanced (RCE) photodetectors. They are attached to an AFM cantilever in very close proximity to the MEMS-VCSEL source with its suspended special NSOM aperture probe described in Embodiment 6. The cantilever is mounted into a special AFM probe holder compatible with conventional AFM. The RCE photodetectors are designed for detection in a narrow spectral range around the wavelength at which the MEMS-VCSEL source emits.

In the described embodiment of the present invention, no far-field optics is necessary for signal collection/detection. NSOM measurements are enabled in the near-field by applying the MEMS-VCSEL excitation source and the near-field RCE photodetectors for signal detection.

Embodiment 8

In yet another embodiment of the present invention, an arrangement of several reverse-biased VCSEL structures, employed as near-field resonant-cavity-enhanced (RCE) photodetectors, are monolithically integrated with the MEMS-VCSEL source with its suspended special NSOM aperture probe, described in Embodiment 6, on the same cantilever made from GaAs substrate. The laser and detector functionalities for RCE AAOP are enabled by an epitaxially grown GaAs-based semiconductor structure. The RCE photodetectors and VCSEL source are formed by processing the epitaxial laser wafer to be in very close proximity to each other to enable near-field detection for RCE AAOP. Monolithically integrated on the same GaAs-based cantilever, the RCE photodetectors and VCSEL source are mounted into a special AFM probe holder compatible with conventional AFM. The monolithic RCE photodetectors are designed for detection in a narrow spectral range around the wavelength at which the MEMS-VCSEL source emits.

In the described embodiment of the present invention, the RCE photodetectors can have a wavelength tuning capability enabled by the electrically tunable bottom and top DBR mirrors of the RCE photodetector cavity. Tuning of the RCE photodetector resonant wavelength is enabled by applying tuning electrical currents through the DBR semiconductor layers to change the temperature and therefore the refractive indices of the layers, and eventually the resonant wavelength of the DBR mirrors.

Alternatively, the wavelength tuning capability of the RCE photodetectors can be enabled by the top DBR mirror composed of dielectric materials possessing large electro-optic effects. Tuning of the RCE photodetector resonant wavelength in this case is enabled by applying a constant voltage across the top DBR dielectric layers to change the refractive indices of the layers, and therefore the resonant wavelength of the top DBR mirror. In the both RCE photodetector configurations, the electrical circuits for wavelength tuning are electrically isolated from the electrical circuit that enables photocurrent detection. The wavelength-tunable RCE photodetectors can be used as a Raman spectrometer/detector.

In the described embodiment of the present invention, no far-field optics is necessary for signal collection/detection. NSOM measurements are enabled in the near-field by applying the MEMS-VCSEL excitation source and the monolithically integrated RCE photodetectors for signal detection. In the case of tunable RCE photodetectors, TERS measurements are enabled in the near-field by applying the MEMS-VCSEL excitation source and the monolithically integrated tunable RCE photodetectors for Raman signal detection.

Embodiment 9

In yet another embodiment of the present invention, a ring-shaped RCE photodetector is monolithically integrated with the MEMS-VCSEL source with its suspended special NSOM aperture probe, described in Embodiment 6, on the same cantilever made from GaAs substrate. The laser and detector functionalities for RCE AAOP are enabled by an epitaxially grown GaAs-based semiconductor structure. The ring RCE photodetector and VCSEL source are formed by processing the epitaxial laser wafer to be in very close proximity to each other to enable near-field detection for RCE AAOP. Monolithically integrated on the same GaAs-based cantilever, the ring RCE photodetector and MEMS-VCSEL source are mounted into a special AFM probe holder compatible with conventional AFM. The monolithic RCE photodetector is designed for detection in a narrow spectral range around the wavelength at which the MEMS-VCSEL source emits.

In the described embodiment of the present invention, the ring-shaped RCE photodetector can have a wavelength tuning capability enabled by the electrically tunable bottom and top DBR mirrors of the RCE photodetector cavity. Tuning of the ring-shaped RCE photodetector resonant wavelength is enabled by applying tuning electrical currents through the DBR semiconductor layers to change the temperature and therefore the refractive indices of the layers, and eventually the resonant wavelength of the DBR mirrors.

Alternatively, the wavelength tuning capability of the ring-shaped RCE photodetector can be enabled by the top DBR mirror composed of dielectric materials possessing large electro-optic effects. Tuning of the ring-shaped RCE photodetector resonant wavelength in this case is enabled by applying a constant voltage across the top DBR dielectric layers to change the refractive indices of the layers, and therefore the resonant wavelength of the top DBR mirror. In the both ring-shaped RCE photodetector configurations, the electrical circuits for wavelength tuning are electrically isolated from the electrical circuit that enables photocurrent detection. The wavelength-tunable ring-shaped RCE photodetector can be used as a Raman spectrometer/detector.

In the described embodiment of the present invention, no far-field optics is necessary for signal collection/detection. NSOM measurements are enabled in the near-field by applying the MEMS-VCSEL excitation source and the monolithically integrated ring-shaped RCE photodetector for signal detection. In the case of tunable ring-shaped RCE photodetector, TERS measurements are enabled in the near-field by applying the MEMS-VCSEL excitation source and the monolithically integrated tunable ring-shaped RCE photodetector for Raman signal detection.

Embodiment 10

Figure 11:
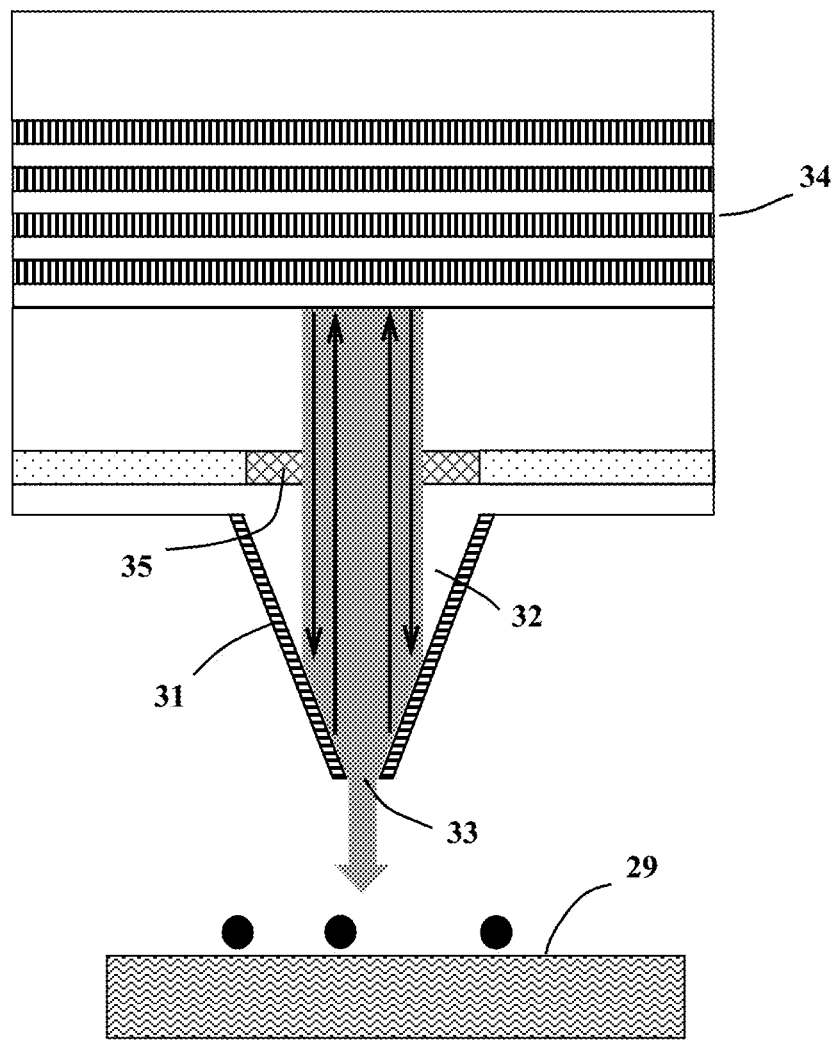
FIG. 11 is a schematic illustration of Embodiment 10 of a resonant-cavity-enhanced AFM active optical probe according to the invention.

In yet another embodiment of the present invention, the probe monolithically combines a light source (VCSEL) and a special aperture NSOM probe in the internal-resonant-cavity configuration. In this internal-resonant-cavity configuration, the top (output) DBR mirror of the VCSEL is replaced by the gold-coated surface 31 of the aperture probe tip 32 monolithically integrated into the VCSEL structure (FIG. 11). This is achieved by making the top cavity spacer of conical shape, coating it with gold, and creating a small aperture 33 at the apex of the tip. Monolithically integrated into the VCSEL structure, the gold-coated surface of the tip 31 acts as a cavity mirror that together with the bottom DBR mirror 34 forms the high-quality internal cavity of the VCSEL. The effect of greatly enhanced light transmission in such configuration has been demonstrated in the VSALs that have demonstrated more than a $10^4 \times$ increase of output power over metal-coated tapered fibers with comparable aperture diameters [Partovi 1999]. The large intensity of the laser light that builds up in the cavity is efficiently transmitted through the tip aperture and used for excitation of the sample 29 at the nanoscale.

The special NSOM aperture probe may have the asymmetric design described in Embodiment 1 (FIG. 3). The asymmetry introduced by removing a part of the tip apex is expected to improve TERS measurement due to local optical field enhancement at the remaining part of the tip apex.

The VCSEL source with the monolithically integrated special NSOM aperture probe is attached to an AFM cantilever mounted into a special AFM probe holder compatible with conventional AFM. To take advantage of the effect of resonance-enhanced transmission of light through the sub-wavelength aperture 33 of the probe, the gold-coated surface 31 of the tip 32 (that acts as a cavity mirror) has to be at the optimal distance from the laser active region 35 for the laser cavity optical length to meet the phase-matching conditions for lasing. This is achieved by careful design of the cavity spacer layer that is used to make the probe tip.

In the described embodiment of the present invention, NSOM and TERS measurements are enabled by applying far-field optics to collect the scattered light and direct it to a combination of an external Raman spectrometer and an external photodetector.

Embodiment 11

In yet another embodiment of the present invention, an arrangement of several commercial reverse-biased VCSEL structures are employed as near-field resonant-cavity-enhanced (RCE) photodetectors. They are attached to an AFM cantilever in very close proximity to the VCSEL source with its monolithically integrated special aperture NSOM probe described in Embodiment 10. The cantilever is mounted into a special AFM probe holder compatible with conventional AFM. The RCE photodetectors are designed for detection in a narrow spectral range around the wavelength at which the VCSEL source emits.

In the described embodiment of the present invention, no far-field optics is necessary for signal collection/detection. NSOM measurements are enabled in the near-field by applying the VCSEL excitation source and the near-field RCE photodetectors for signal detection.

Embodiment 12

In yet another embodiment of the present invention, an arrangement of several reverse-biased VCSEL structures, employed as near-field resonant-cavity-enhanced (RCE) photodetectors, are monolithically integrated with the VCSEL source with its monolithically integrated special aperture NSOM probe, described in Embodiment 10, on the same cantilever made from GaAs substrate. The laser and detector functionalities for RCE AAOP are enabled by an epitaxially grown GaAs-based semiconductor structure. The RCE photodetectors and VCSEL source are formed by processing the epitaxial laser wafer to be in very close proximity to each other to enable near-field detection for RCE AAOP. Monolithically integrated on the same GaAs-based cantilever, the RCE photodetectors and VCSEL source are mounted into a special AFM probe holder compatible with conventional AFM. The monolithic RCE photodetectors are designed for detection in a narrow spectral range around the wavelength at which the VCSEL source emits.

In the described embodiment of the present invention, the RCE photodetectors can have a wavelength tuning capability enabled by the electrically tunable bottom and top DBR mirrors of the RCE photodetector cavity. Tuning of the RCE photodetector resonant wavelength is enabled by applying tuning electrical currents through the DBR semiconductor layers to change the temperature and therefore the refractive indices of the layers, and eventually the resonant wavelength of the DBR mirrors.

Alternatively, the wavelength tuning capability of the RCE photodetectors can be enabled by the top DBR mirror composed of dielectric materials possessing large electro-optic effects. Tuning of the RCE photodetector resonant wavelength in this case is enabled by applying a constant voltage across the top DBR dielectric layers to change the refractive indices of the layers, and therefore the resonant wavelength of the top DBR mirror. In the both RCE photodetector configurations, the electrical circuits for wavelength tuning are electrically isolated from the electrical circuit that enables photocurrent detection. The wavelength-tunable RCE photodetectors can be used a Raman spectrometer/detector.

In the described embodiment of the present invention, no far-field optics is necessary for signal collection/detection. NSOM measurements are enabled in the near-field by applying the VCSEL excitation source and the monolithically integrated RCE photodetectors for signal detection. In the case of tunable RCE photodetectors, TERS measurements are enabled in the near-field by applying the VCSEL excitation source and the monolithically integrated tunable RCE photodetectors for Raman signal detection.

Embodiment 13

In yet another embodiment of the present invention, the ring-shaped RCE photodetector is monolithically integrated with the VCSEL source monolithically integrated with the special aperture NSOM probe, described in Embodiment 10, on the same cantilever made from GaAs substrate. The laser and detector functionalities for RCE AAOP are enabled by an epitaxially grown GaAs-based semiconductor structure. The ring RCE photodetector and VCSEL source are formed by processing the epitaxial laser wafer to be in very close proximity to each other to enable near-field detection for RCE AAOP. Monolithically integrated on the same GaAs-based cantilever, the ring RCE photodetector and VCSEL source are mounted into a special AFM probe holder compatible with conventional AFM. The monolithic RCE photodetector is designed for detection in a narrow spectral range around the wavelength at which the VCSEL source emits.

In the described embodiment of the present invention, the ring-shaped RCE photodetector can have a wavelength tuning capability enabled by the electrically tunable bottom and top DBR mirrors of the RCE photodetector cavity. Tuning of the ring-shaped RCE photodetector resonant wavelength is enabled by applying tuning electrical currents through the DBR semiconductor layers to change the temperature and therefore the refractive indices of the layers, and eventually the resonant wavelength of the DBR mirrors.

Alternatively, the wavelength tuning capability of the ring-shaped RCE photodetector can be enabled by the top DBR mirror composed of dielectric materials possessing large electro-optic effects. Tuning of the ring-shaped RCE photodetector resonant wavelength in this case is enabled by applying a constant voltage across the top DBR dielectric layers to change the refractive indices of the layers, and therefore the resonant wavelength of the top DBR mirror. In the both ring-shaped RCE photodetector configurations, the electrical circuits for wavelength tuning are electrically isolated from the electrical circuit that enables photocurrent detection. The wavelength-tunable ring-shaped RCE photodetector can be used a Raman spectrometer/detector.

In the described embodiment of the present invention, no far-field optics is necessary for signal collection/detection. NSOM measurements are enabled in the near-field by applying the VCSEL excitation source and the monolithically integrated ring-shaped RCE photodetector for signal detection. In the case of tunable ring-shaped RCE photodetector, TERS measurements are enabled in the near-field by applying the VCSEL excitation source and the monolithically integrated tunable ring-shaped RCE photodetector for Raman signal detection.

REFERENCES CITED

[Garcia-Vidal 2010] F. J. Garcia-Vidal, L. Martin-Moreno, T. W. Ebbesen, L. Kuipers, "Light passing through sub-wavelength apertures", Rev. Mod. Phys. 82 (#1), pp. 729-787, 2010.

[Kalkum 2010] F. Kalkum, M. Peter, G. Barbastathis, K. Buse, "External-resonance-enhanced transmission of light through sub-wavelength holes", Appl. Phys. B, vol. 100 (#1), pp. 169-172, 2010.

[Partovi 1999] A. Partovi, D. Peale, M. Wuttig, C. A. Murray, G. Zydzik, L. Hopkins, K. Baldwin, W. S. Hobson, J. Wynn, J. Lopata, et al., "High-power laser light source for near-field optics and its application to high-density optical data storage," Appl. Phys. Lett., vol. 75(#11), pp. 1515-1517, 1999.

We claim:
1. An atomic force microscopy (AFM) active optical probe comprising:
a semiconductor laser source; and an aperture AFM/near-field scanning optical microscopy (NSOM) probe, wherein the semiconductor laser source is a vertical-cavity surface: emitting laser (VCSEL), and the output distributed Bragg reflector (DBR) mirror of the VCSEL and the gold-coated surface of the tip of the aperture AFM/NSOM probe form a high-quality external Fabry-Pérot cavity employed for enhanced transmission of light through the tip aperture.

2. The AFM active optical probe of claim 1, wherein the VCSEL source is mounted onto an x-y-z piezo stage attached to a special AFM probe holder for precise positioning relative to the probe tip, where said probe tip is an integral part of an AFM cantilever independently attached to the special AFM probe holder compatible with conventional AFM.

3. The AFM active optical probe of claim 2, wherein the probe tip has conical or pyramidal shape.

4. The AFM active optical probe of claim 3, wherein the probe tip has asymmetric design as a result of part of the tip apex being removed.

5. The AFM active optical probe of claim 2, wherein the VCSEL source is an optically pumped VCSEL that generates light at a longer wavelength than the wavelength of the optical pumping, and a special notch (band-stop) or longpass edge filter is placed inside the external cavity formed by the top (output) DBR mirror of the VCSEL and the gold-coated surface of the tip of a special aperture NSOM probe to prevent the optical pumping from reaching the surface of the sample.

6. The AFM active optical probe of claim 5, wherein the probe tip has conical or pyramidal shape.

7. The AFM active optical probe of claim 6, wherein the probe tip has asymmetric design as a result of part of the tip apex being removed.

8. The AFM optical probe of claim 2, further comprising an arrangement of several commercial reverse-biased VCSEL structures employed as near-field resonant-cavity-enhanced (RCE) photodetectors, mounted in very close proximity to the VCSEL source onto the same x-y-z piezo stage attached to the special AFM probe holder for precise positioning relative to the probe tip.

9. The AFM active optical probe of claim 8, wherein the probe tip has conical or pyramidal shape.

10. The AFM active optical probe of claim 9, wherein the probe tip has asymmetric design as a result of part of the tip apex being removed.

11. The AFM active optical probe of claim 1, further comprising an arrangement of several reverse-biased VCSEL structures, employed as near-field resonant-cavity-enhanced (RCE) photodetectors, monolithically integrated with the VCSEL source on the same GaAs substrate, wherein the RCE photodetectors and VCSEL source are formed by processing the epitaxial laser wafer to be in very close proximity to each other to enable near-field detection for the probe, and the monolithic RCE photodetectors are designed for detection in a narrow spectral range around the wavelength at which the VCSEL source emits.

12. The AFM active optical probe of claim 11, wherein the RCE photodetectors and VCSEL source, monolithically integrated on the same semiconductor substrate, are mounted onto an x-y-z piezo stage attached to a special AFM probe holder for precise positioning relative to the probe tip, where said probe tip is an integral part of an AFM cantilever independently attached to the special AFM probe holder compatible with conventional AFM.

13. The AFM active optical probe of claim 12, wherein the probe tip has conical or pyramidal shape.

14. The AFM active optical probe of claim 13, wherein the probe tip has asymmetric design as a result of part of the tip apex being removed.

15. The AFM active optical probe of claim 11, wherein the optical probe is based on alternative III-V semiconductors such as InP, GaP, GaSb, and GaN to expand the available wavelength coverage from ultraviolet to visible and mid-infrared.

16. The AFM active optical probe of claim 12, wherein each of the RCE photodetector has a wavelength tuning capability enabled by the electrically tunable bottom and top DBR mirrors of the RCE photodetector cavity and can be used as a Raman spectrometer/detector.

17. The AFM active optical probe of claim 16, wherein the probe tip has conical or pyramidal shape.

18. The AFM active optical probe of claim 17, wherein the probe tip has asymmetric design as a result of part of the tip apex being removed.

19. The AFM active optical probe of claim 16, wherein the optical probe is based on alternative III-V semiconductors such as InP, GaP, GaSb, and GaN to expand the available wavelength coverage from ultraviolet to visible and mid-infrared.

20. The AFM active optical probe of claim 1, further comprising a ring-shaped resonant-cavity-enhanced (RCE) photodetector monolithically integrated with the VCSEL source on the same GaAs substrate, wherein the ring RCE photodetector and VCSEL source are formed by processing the epitaxial laser wafer to be in very close proximity to each other to enable near-field detection for the probe, and the monolithic RCE photodetector is designed for detection in a narrow spectral range around the wavelength at which the VCSEL source emits.

21. The AFM active optical probe of claim 20, wherein the ring RCE photodetector and VCSEL source, monolithically integrated on the same semiconductor substrate, are mounted onto an x-y-z piezo stage attached to a special AFM probe holder for precise positioning relative to the probe tip, where said probe tip is an integral part of an AFM cantilever independently attached to the special AFM probe holder compatible with conventional AFM.

22. The AFM active optical probe of claim 21, wherein the probe tip has conical or pyramidal shape.

23. The AFM active optical probe of claim 22, wherein the probe tip has asymmetric design as a result of part of the tip apex being removed.

24. The AFM active optical probe of claim 20, wherein the optical probe is based on alternative III-V semiconductors such as InP, GaP, GaSb, and GaN to expand the available wavelength coverage from ultraviolet to visible and mid-infrared.

25. The AFM active optical probe of claim 21, wherein the ring-shaped RCE photodetector has a wavelength tuning capability enabled by the electrically tunable bottom and top DBR mirrors of the RCE photodetector cavity and can be used as a Raman spectrometer/detector.

26. The AFM active optical probe of claim 25, wherein the probe tip has conical or pyramidal shape.

27. The AFM active optical probe of claim 26, wherein the probe tip has asymmetric design as a result of part of the tip apex being removed.

28. The AFM active optical probe of claim 25, wherein the optical probe is based on alternative III-V semiconductors such as InP, GaP, GaSb, and GaN to expand the available wavelength coverage from ultraviolet to visible and mid-infrared.

29. An atomic force (AFM) active optical probe comprising:
   a semiconductor laser source; and
   an aperture AFM/near-field scanning optical microscopy (NSOM) probe, wherein the semiconductor laser source is a vertical-cavity surface-emitting laser (VCSEL), and the bottom distributed Bragg reflector (DBR) mirror of the VCSEL and the gold-coated surface of the tip of the aperture AFM/NSOM probe, suspended above the laser active region on the membrane of a microelectromechanical system (MEMS), form a high-quality internal laser cavity of the MEMS-VCSEL employed for enhanced transmission of light through the tip aperture.

30. The AFM active optical probe of claim 29, wherein the MEMS-VCSEL source with the suspended special NSOM aperture probe is attached to an AFM cantilever mounted into a special AFM probe holder compatible with conventional AFM.

31. The AFM active optical probe of claim 30, wherein the probe tip has conical or pyramidal shape.

32. The AFM active optical probe of claim 31, wherein the probe tip has asymmetric design as a result of part of the tip apex being removed.

33. The AFM optical probe of claim 30, further comprising an arrangement of several commercial reverse-biased VCSEL structures employed as near-field resonant-cavity-enhanced (RCE) photodetectors and attached to the same AFM cantilever in very close proximity to the MEMS-VCSEL source with its suspended special NSOM aperture probe.

34. The AFM active optical probe of claim 33, wherein the probe tip has conical or pyramidal shape.

35. The AFM active optical probe of claim 34, wherein the probe tip has asymmetric design as a result of part of the tip apex being removed.

36. The AFM active optical probe of claim 29, further comprising an arrangement of several reverse-biased VCSEL structures, employed as near-field resonant-cavity-enhanced (RCE) photodetectors, monolithically integrated with the MEMS-VCSEL source of claim 29 on the same GaAs substrate, wherein the RCE photodetectors and MEMS-VCSEL source are formed by processing the epitaxial laser wafer to be in very close proximity to each other to enable near-field detection for the probe, and the monolithic RCE photodetectors are designed for detection in a narrow spectral range around the wavelength at which the MEMS-VCSEL source emits.

37. The AFM active optical probe of claim 36, wherein the RCE photodetectors and MEMS-VCSEL source, monolithically integrated on the same GaAs-based cantilever, are mounted into a special AFM probe holder compatible with conventional AFM.

38. The AFM active optical probe of claim 37, wherein the probe tip has conical or pyramidal shape.

39. The AFM active optical probe of claim 38, wherein the probe tip has asymmetric design as a result of part of the tip apex being removed.

40. The AFM active optical probe of claim 36, wherein the optical probe is based on alternative III-V semiconductors such as InP, GaP, GaSb, and GaN to expand the available wavelength coverage from ultraviolet to visible and mid-infrared.

41. The AFM active optical probe of claim 37, wherein the ring-shaped RCE photodetector has a wavelength tuning capability enabled by the electrically tunable bottom and top DBR mirrors of the RCE photodetector cavity and can be used as a Raman spectrometer/detector.

42. The AFM active optical probe of claim 41, wherein the probe tip has conical or pyramidal shape.

43. The AFM active optical probe of claim 42, wherein the probe tip has asymmetric design as a result of part of the tip apex being removed.

44. The AFM active optical probe of claim 41, wherein the optical probe is based on alternative III-V semiconductors such as InP, GaP, GaSb, and GaN to expand the available wavelength coverage from ultraviolet to visible and mid-infrared.

45. The AFM active optical probe of claim 29, further comprising a ring-shaped resonant-cavity-enhanced (RCE) photodetector monolithically integrated with the MEMS-VCSEL source on the same GaAs substrate, wherein the ring RCE photodetector and MEMS-VCSEL source are formed by processing the epitaxial laser wafer to be in very close proximity to each other to enable near-field detection for the probe, and the monolithic RCE photodetector is designed for detection in a narrow spectral range around the wavelength at which the MEMS-VCSEL source emits.

46. The AFM active optical probe of claim 45, wherein the ring RCE photodetector and MEMS-VCSEL source, monolithically integrated on the same GaAs-based cantilever, are mounted into a special AFM probe holder compatible with conventional AFM.

47. The AFM active optical probe of claim 46, wherein the probe tip has conical or pyramidal shape.

48. The AFM active optical probe of claim 47, wherein the probe tip has asymmetric design as a result of part of the tip apex being removed.

49. The AFM active optical probe of claim 45, wherein the optical probe is based on alternative III-V semiconductors such as InP, GaP, GaSb, and GaN to expand the available wavelength coverage from ultraviolet to visible and mid-infrared.

50. The AFM active optical probe of claim 46, wherein the ring-shaped RCE photodetector has a wavelength tuning capability enabled by the electrically tunable bottom and top DBR mirrors of the RCE photodetector cavity and can be used as a Raman spectrometer/detector.

51. The AFM active optical probe of claim 50, wherein the probe tip has conical or pyramidal shape.

52. The AFM active optical probe of claim 51, wherein the probe tip has asymmetric design as a result of part of the tip apex being removed.

53. The AFM active optical probe of claim 50, wherein the optical probe is based on alternative III-V semiconductors such as InP, GaP, GaSb, and GaN to expand the available wavelength coverage from ultraviolet to visible and mid-infrared.

54. The AFM active optical probe of claim 29, wherein the semiconductor laser source is a vertical-cavity surface emitting laser (VCSEL), and the top (output) DBR mirror of the VCSEL is replaced by the gold-coated surface of the aperture probe tip monolithically integrated into the VCSEL structure, and said gold-coated surface of the tip acts as a cavity mirror that together with the bottom DBR mirror forms a high-quality internal cavity of the VCSEL employed for enhanced transmission of light through the tip aperture.

55. The AFM active optical probe of claim 54, wherein the gold-coated surface of the aperture probe tip is monolithically integrated into the VCSEL structure by making the top cavity spacer of the VCSEL in the form of a tip, coating it with gold, and creating a small aperture at the apex of the tip.

56. The AFM active optical probe of claim 55, wherein the VCSEL source with its monolithically integrated special NSOM aperture probe is attached to an AFM cantilever mounted into a special AFM probe holder compatible with conventional AFM.

57. The AFM active optical probe of claim 56, wherein the probe tip has conical or pyramidal shape.

58. The AFM active optical probe of claim 57, wherein the probe tip has asymmetric design as a result of part of the tip apex being removed.

59. The AFM optical probe of claim 56, further comprising an arrangement of several commercial reverse-biased VCSEL structures employed as near-field resonant-cavity-enhanced (RCE) photodetectors and attached to the same AFM cantilever in very close proximity to the VCSEL source with its monolithically integrated special NSOM aperture probe.

60. The AFM active optical probe of claim 59, wherein the probe tip has conical or pyramidal shape.

61. The AFM active optical probe of claim 59, wherein the probe tip has asymmetric design as a result of part of the tip apex being removed.

62. The AFM active optical probe of claim 55, further comprising an arrangement of several reverse-biased VCSEL structures, employed as near-field resonant-cavity-enhanced (RCE) photodetectors, monolithically integrated with the VCSEL source of claim 55 on the same GaAs substrate, wherein the RCE photodetectors and VCSEL source are formed by processing the epitaxial laser wafer to be in very close proximity to each other to enable near-field detection for the probe, and the monolithic RCE photodetectors are designed for detection in a narrow spectral range around the wavelength at which the VCSEL source emits.

63. The AFM active optical probe of claim 62, wherein the RCE photodetectors and VCSEL source, monolithically integrated on the same GaAs-based cantilever, are mounted into a special AFM probe holder compatible with conventional AFM.

64. The AFM active optical probe of claim 63 wherein the probe tip has conical or pyramidal shape.

65. The AFM active optical probe of claim 64, wherein the probe tip has asymmetric design as a result of part of the tip apex being removed.

66. The AFM active optical probe of claim 62, wherein the optical probe is based on alternative III-V semiconductors such as InP, GaP, GaSb, and GaN to expand the available wavelength coverage from ultraviolet to visible and mid-infrared.

67. The AFM active optical probe of claim 63, wherein the RCE photodetectors have a wavelength tuning capability enabled by the electrically tunable bottom and top DBR mirrors of the RCE photodetector cavity and can be used as a Raman spectrometer/detector.

68. The AFM active optical probe of claim 67, wherein the probe tip has conical or pyramidal shape.

69. The AFM active optical probe of claim 68, wherein the probe tip has asymmetric design as a result of part of the tip apex being removed.

70. The AFM active optical probe of claim 67, wherein the optical probe is based on alternative III-V semiconductors such as InP, GaP, GaSb, and GaN to expand the available wavelength coverage from ultraviolet to visible and mid-infrared.

71. The AFM active optical probe of claim 55, further comprising a ring-shaped resonant-cavity-enhanced (RCE) photodetector monolithically integrated with the VCSEL source of claim 55 on the same GaAs substrate, wherein the ring RCE photodetector and VCSEL source are formed by processing the epitaxial laser wafer to be in very close proximity to each other to enable near-field detection for the probe, and the monolithic RCE photodetector is designed for detection in a narrow spectral range around the wavelength at which the VCSEL source emits.

72. The AFM active optical probe of claim 71, wherein the ring RCE photodetector and VCSEL source, monolithically integrated on the same GaAs-based cantilever, are mounted into a special AFM probe holder compatible with conventional AFM.

73. The AFM active optical probe of claim 72 wherein the probe tip has conical or pyramidal shape.

74. The AFM active optical probe of claim 73, wherein the probe tip has asymmetric design as a result of part of the tip apex being removed.

75. The AFM active optical probe of claim 71, wherein the optical probe is based on alternative III-V semiconductors such as InP, GaP, GaSb, and GaN to expand the available wavelength coverage from ultraviolet to visible and mid-infrared.

76. The AFM active optical probe of claim 72, wherein the ring-shaped RCE photodetector has a wavelength tuning capability enabled by the electrically tunable bottom and top DBR mirrors of the RCE photodetector cavity and can be used as a Raman spectrometer/detector.

77. The AFM active optical probe of claim 76, wherein the probe tip has conical or pyramidal shape.

78. The AFM active optical probe of claim 77, wherein the probe tip has asymmetric design as a result of part of the tip apex being removed.

79. The AFM active optical probe of claim 76, wherein the optical probe is based on alternative III-V semiconductors such as InP, GaP, GaSb, and GaN to expand the available wavelength coverage from ultraviolet to visible and mid-infrared.

* * * * *